US009460981B2

(12) United States Patent
Yamada

(10) Patent No.: US 9,460,981 B2
(45) Date of Patent: Oct. 4, 2016

(54) SEMICONDUCTOR MODULE

(71) Applicant: FUJI ELECTRIC CO., LTD., Kawasaki-shi (JP)

(72) Inventor: Takafumi Yamada, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/937,383

(22) Filed: Nov. 10, 2015

(65) Prior Publication Data
US 2016/0064302 A1   Mar. 3, 2016

Related U.S. Application Data

(63) Continuation of application No. PCT/JP2014/074485, filed on Sep. 17, 2014.

(30) Foreign Application Priority Data

Oct. 29, 2013   (JP) ................ 2013-224424

(51) Int. Cl.
*H01L 23/48* (2006.01)
*H01L 23/367* (2006.01)
(Continued)

(52) U.S. Cl.
CPC ......... *H01L 23/3675* (2013.01); *C04B 37/021* (2013.01); *H01L 23/3735* (2013.01); *H01L 23/4334* (2013.01); *H01L 23/49811* (2013.01); *H01L 23/49833* (2013.01); *H01L 23/49844* (2013.01); *H01L 23/49894* (2013.01); *H01L 24/01* (2013.01); *H01L 25/07* (2013.01); *H01L 25/11* (2013.01); *H01L 25/18* (2013.01); *C04B 2237/366* (2013.01); *C04B 2237/407* (2013.01);
(Continued)

(58) Field of Classification Search
CPC .......... H01L 23/3735; H01L 23/3675; H01L 23/49811; H01L 23/49838
See application file for complete search history.

(56) References Cited

U.S. PATENT DOCUMENTS 9,299,637 B2 * 3/2016 Yamada ................. H01L 23/29
2007/0216013 A1   9/2007 Funakoshi et al.
(Continued)

FOREIGN PATENT DOCUMENTS

JP    2005-093593 A    4/2005
JP    2007-251076 A    9/2007
(Continued)

OTHER PUBLICATIONS

PCT, International Search Report for International Application No. PCT/JP2014/074485.

*Primary Examiner* — Nicholas Tobergte
(74) *Attorney, Agent, or Firm* — Manabu Kanesaka

(57) ABSTRACT

A semiconductor module uses pin bonding and improves cooling capacity. The semiconductor module includes a semiconductor element; a pin electrically and thermally connected to an upper surface of the semiconductor element; a pin wiring substrate having a first metal film and a second metal film respectively provided on the rear and front surfaces of a pin wiring insulating substrate, the first metal film being bonded to the pin; a first DCB substrate having a third metal film and a fourth metal film respectively provided on the rear and front surfaces of a first ceramic insulating substrate, the third metal film being bonded to a lower surface of the semiconductor element; a first cooler thermally connected to the fourth metal film; and a second cooler that thermally connected to the second metal film.

9 Claims, 4 Drawing Sheets

(51) Int. Cl.
*H01L 23/373* (2006.01)
*H01L 23/433* (2006.01)
*H01L 23/498* (2006.01)
*H01L 25/07* (2006.01)
*H01L 25/18* (2006.01)
*H01L 23/00* (2006.01)
*C04B 37/02* (2006.01)
*H01L 25/11* (2006.01)
*H01L 23/473* (2006.01)

(52) U.S. Cl.
CPC ........ *H01L 23/473* (2013.01); *H01L 23/49861* (2013.01); *H01L 2924/13055* (2013.01); *H01L 2924/13091* (2013.01)

(56) References Cited

U.S. PATENT DOCUMENTS

| | | |
|---|---|---|
| 2011/0037166 A1 | 2/2011 | Ikeda et al. |
| 2012/0241953 A1 | 9/2012 | Yamada et al. |
| 2013/0039013 A1* | 2/2013 | Waegli ................ H05K 1/0204 361/720 |
| 2014/0367632 A1* | 12/2014 | Byun .................. H01L 51/0003 257/9 |
| 2014/0374775 A1* | 12/2014 | Saito ....................... H01L 24/40 257/77 |

FOREIGN PATENT DOCUMENTS

| | | |
|---|---|---|
| JP | 2009-064852 A | 3/2009 |
| WO | 2009/125779 A1 | 10/2009 |
| WO | 2011/083737 A1 | 7/2011 |

* cited by examiner

SEMICONDUCTOR MODULE

CROSS REFERENCE TO RELATED APPLICATION

The present application is a Continuation Application of PCT International Application No. PCT/JP2014/074485 filed on Sep. 17, 2014, and claims priority from Japanese Patent Application No. 2013-224424 filed on Oct. 29, 2013, the disclosure of which is incorporated herein.

TECHNICAL FIELD

The present invention relates to a semiconductor module which uses pin bonding and has improved cooling capacity.

BACKGROUND ART

The following Patent Documents 1 and 2 disclose a semiconductor module with improved cooling capacity.

Patent Document 1 discloses a structure in which a semiconductor chip and a metal plate are provided between insulating substrates, each of which has metal films formed on both surfaces, and the outer surface of each insulating substrate is bonded to a cooler.

Patent Document 2 discloses a structure in which a semiconductor chip and lead electrodes are provided between insulating substrates, each of which has metal films formed on both surfaces, a copper base is provided on the outer surface of each insulating substrate, and a heat sink (cooler) is provided on the outer surface of each copper base (radiator plate).

Patent Document 3 discloses a semiconductor module using pin bonding. Patent Document 3 discloses a structure in which a semiconductor chip and a printed circuit board are connected by an implant pin.

CITATION LIST

Patent Document

Patent Document 1: WO2009/125779
Patent Document 2: JP 2007-251076 A
Patent Document 3: WO2011/083737

Problem to be Solved by the Invention

The structure disclosed in Patent Document 1 has the problem that thermal stress is applied between the wire and the electrode which are connected to each other by wire bonding when power is supplied to the semiconductor element and the wire is likely to be detached from the electrode when the semiconductor element is repeatedly turned on and off for a long time.

In the structure disclosed in Patent Document 2, the lead electrode replaces the wire disclosed in Patent Document 1. Therefore, there is a concern that the same detachment phenomenon as that in Patent Document 1 will occur.

Patent Document 3 discloses the semiconductor module with the pin bonding structure which is considered as measures to suppress the above-mentioned detachment phenomenon. However, the semiconductor module has the problem such that cooling capacity is low since only one surface of the semiconductor element is cooled and it is difficult to increase power.

Accordingly, an object of the invention is to provide a semiconductor module which uses pin bonding and has improved cooling capacity.

Means for Solving Problem

In order to achieve the object, a semiconductor module according to the invention includes a semiconductor element; a pin that is electrically and thermally connected to an upper surface of the semiconductor element; a pin wiring substrate that includes a pin wiring insulating substrate, a first metal film provided on a rear surface of the pin wiring insulating substrate, and a second metal film provided on a front surface of the pin wiring insulating substrate, the first metal film being bonded to the pin; a first DCB substrate that includes a first ceramic insulating substrate, a third metal film provided on a front surface of the first ceramic insulating substrate, and a fourth metal film provided on a rear surface of the first ceramic insulating substrate, the third metal film being bonded to a lower surface of the semiconductor element; a first cooler that is thermally connected to the fourth metal film; and a second cooler that is thermally connected to the second metal film.

An embodiment of the semiconductor module according to the invention may further include a second DCB substrate that includes a second ceramic insulating substrate, a fifth metal film provided on a rear surface of the second ceramic insulating substrate, and a sixth metal film provided on a front surface of the second ceramic insulating substrate. The second DCB substrate may be provided between the second metal film and the second cooler so as to be thermally connected to the second metal film and the second cooler.

In another embodiment of the semiconductor module according to the invention, a heat spreader may be provided between the second metal film and the second cooler so as to be thermally connected to the second metal film and the second cooler.

In the semiconductor module according to the above-mentioned embodiments of the invention, a plurality of sets of the semiconductor element and the pin may be provided.

In the semiconductor module according to the above-mentioned embodiments of the invention, an input terminal and an output terminal of the semiconductor element may extend from between the first cooler and the second cooler to the outside.

In still another embodiment of the semiconductor module according to the invention, a plurality of semiconductor module units, each of which has the above-mentioned semiconductor module as a unit module, may be arranged in a row such that side surfaces from which the input and output terminals of the semiconductor elements do not protrude face each other.

In the semiconductor module according to the invention, each of the first cooler and the second cooler may be integrally provided so as to cover the entire row of the module units.

The semiconductor module according to the invention may be sealed with a sealing resin except for the first cooler, a surface which is thermally connected to the first cooler, the second cooler, and a surface which is thermally connected to the second cooler in the semiconductor module.

Effect of the Invention

According to the invention, the pin wiring substrate is electrically and thermally connected to the surface of the semiconductor element through the pin. Therefore, the pin wiring substrate functions as a heat spreader for increasing a heat transmission area and can transfer a large amount of heat from the upper surface of the semiconductor module. Since two coolers are used to cool the upper and lower surfaces of the semiconductor module. Therefore, it is possible to provide a semiconductor module with high cooling capacity and a high output.

DETAILED DESCRIPTION FOR CARRYING OUT THE INVENTION

Figure 1:
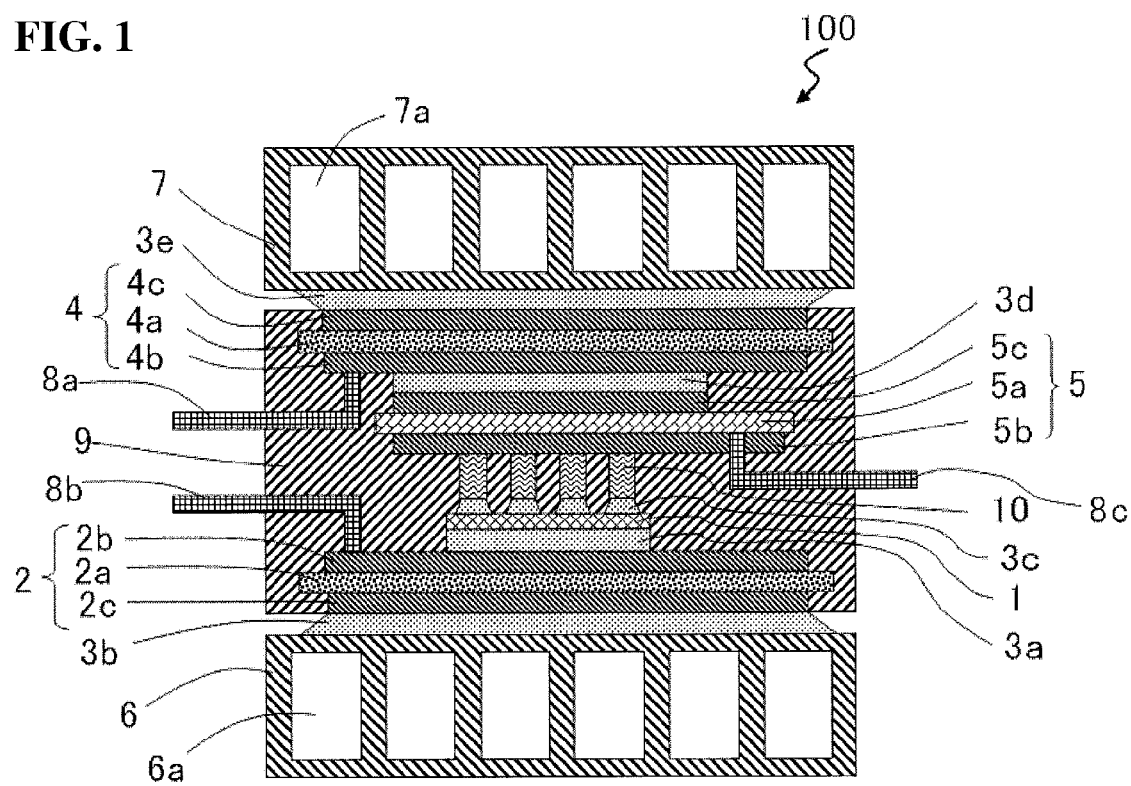
FIG. 1 is a cross-sectional view schematically illustrating a semiconductor module according to a first embodiment of the invention.

Hereinafter, embodiments of a semiconductor module according to the invention will be described with reference to the drawings. The same components are denoted by the same reference numerals and the description thereof will not be repeated. The invention is not limited to the following embodiments and can be appropriately modified without departing from the scope and spirit of the invention.

First Embodiment of the Invention

First, a first embodiment of the invention will be described.

FIG. 1 is a cross-sectional view schematically illustrating a semiconductor module 100 according to the first embodiment of the invention. The semiconductor module 100 includes a semiconductor element 1, a first DCB substrate 2, a first ceramic insulating substrate 2a, a third metal film 2b, a fourth metal film 2c, solder 3a, solder 3b, solder 3c, solder 3d, solder 3e, a second DCB substrate 4, a second ceramic insulating substrate 4a, a fifth metal film 4b, a sixth metal film 4c, a pin wiring substrate 5, a pin wiring insulating substrate 5a, a first metal film (circuit layer) 5b, a second metal film 5c, a first cooler 6, a cooling medium path 6a, a second cooler 7, a cooling medium path 7a, a terminal 8a, a terminal 8b, a terminal 8c, a sealing resin 9, and a pin 10.

The semiconductor element 1 is not particularly limited. For example, the semiconductor element 1 may be an insulated gate bipolar transistor (IGBT), a power metal oxide semiconductor field effect transistor (MOSFET), or a free wheeling diode (FWD). Alternatively, the semiconductor element 1 may be a reverse blocking-insulated gate bipolar transistor (RB-IGBT) or a reverse conducting-insulated gate bipolar transistor (RC-IGBT) which is obtained by forming the transistors and the diode in one semiconductor element in the vertical direction.

The pin wiring substrate 5 includes the pin wiring insulating substrate 5a, the first metal film (circuit layer) 5b, and the second metal film 5c. The first metal film (circuit layer) 5b is provided so as to face the semiconductor element 1. The material forming the pin wiring insulating substrate 5a is not particularly limited. However, the pin wiring insulating substrate 5a is preferably made of a material with high permittivity and high thermal conductivity. For example, the pin wiring insulating substrate 5a can be made of $Si_3N_4$, AlN, or $Al_2O_3$. The material forming the first metal film (circuit layer) 5b and the second metal film 5c is not particularly limited. The first metal film 5b and the second metal film 5c are preferably made of a material with low electric resistance and high thermal conductivity. For example, the first and second metal films can be made of copper.

The material forming the pin 10 is not particularly limited. The pin 10 is made of a metal material with low electric resistance and high thermal conductivity. Specifically, the pin 10 is preferably made of copper. One end of the pin 10 is bonded to the upper surface of the semiconductor element 1 by the solder 3c and the other end thereof is bonded to the first metal film (circuit layer) 5b. According to the above-mentioned structure, heat generated from the semiconductor element 1 can be transferred to the first metal film 5b, the pin wiring insulating substrate 5a, and the first metal film 5c through the pin 10. The pin wiring substrate 5 functions as a heat spreader for increasing a heat transmission area and can improve the cooling efficiency of the semiconductor module 100. In addition, it is preferable that a plurality of pins 10 be provided for one semiconductor element 1. In this case, it is possible to reduce electric resistance and to improve thermal conductivity.

The first DCB substrate 2 includes the first ceramic insulating substrate 2a, the third metal film 2b, and the fourth metal film 2c. The third metal film 2b is provided on the front surface of the first ceramic insulating substrate 2a and the fourth metal film 2c is provided on the rear surface of the first ceramic insulating substrate 2a. The third metal film 2b of the first DCB substrate 2 is bonded to the lower surface of the semiconductor element 1. The DCB is an abbreviation of direct copper bonding. In the DCB, a metal film, such as a copper film, is directly bonded to a ceramic insulating substrate. Since the ceramic insulating substrate 2a has an insulation property, the third metal film 2b and the fourth metal film 2c are electrically insulated from each other. The material forming the ceramic insulating substrate 2a is not particularly limited. The first ceramic insulating substrate 2a is preferably made of a material with high thermal conductivity. For example, the first ceramic insulating substrate 2a can be made of AlN.

The lower surface of the semiconductor element 1 and the third metal film 2b are electrically and thermally connected to each other by the solder 3a. The third metal film 2b and the fourth metal film 2c are electrically insulated from each other by the first ceramic insulating substrate 2a. However, thermal conductivity between the third metal film 2b and the fourth metal film 2c is high. The fourth metal film 2c of the first DCB substrate 2 and the outer wall of the first cooler 6 are connected to each other by the solder 3b.

The second DCB substrate 4 is provided between the pin wiring substrate 5 and the second cooler 7. The second DCB substrate 4 includes the second ceramic insulating substrate 4a, the fifth metal film 4b, and the sixth metal film 4c. The fifth metal film 4b is provided on the rear surface of the second ceramic insulating substrate 4a and the sixth metal film is provided on the front surface of the second ceramic insulating substrate 4a. The second metal film 5c of the pin wiring substrate 5 is electrically and thermally connected to the fifth metal film 4b of the second DCB substrate 4 by the solder 3d. The fifth metal film 4b and the sixth metal film 4c of the second DCB substrate 4 are electrically insulated from each other by the second ceramic insulating substrate 4a.

However, thermal conductivity between the fifth metal film 4b and the sixth metal film 4c is high. The sixth metal film 4c of the second DCB substrate 4 and the outer wall of the second cooler 7 are connected to each other by the solder 3e.

According to the above-mentioned structure, heat generated from the semiconductor element can be transferred from the lower surface of the semiconductor element 1 to the first cooler 6 through the first DCB substrate 2. In addition, the heat can be transferred to the pin wiring substrate 5 through the pin 10 connected to the upper surface of the semiconductor element 1, transferred to the second DCB substrate 4, and then transferred to the second cooler 7. The pin wiring substrate 5 functions as not only a wiring substrate but also a heat spreader for increasing the heat transmission area. The second DCB substrate 4 can further disperse the flow of heat and prevent the generation of a hot spot.

The semiconductor module is not limited to the structure that includes one semiconductor element 1. However, the semiconductor module may include a plurality of sets of the semiconductor element 1 and the pin 10.

Figure 2:
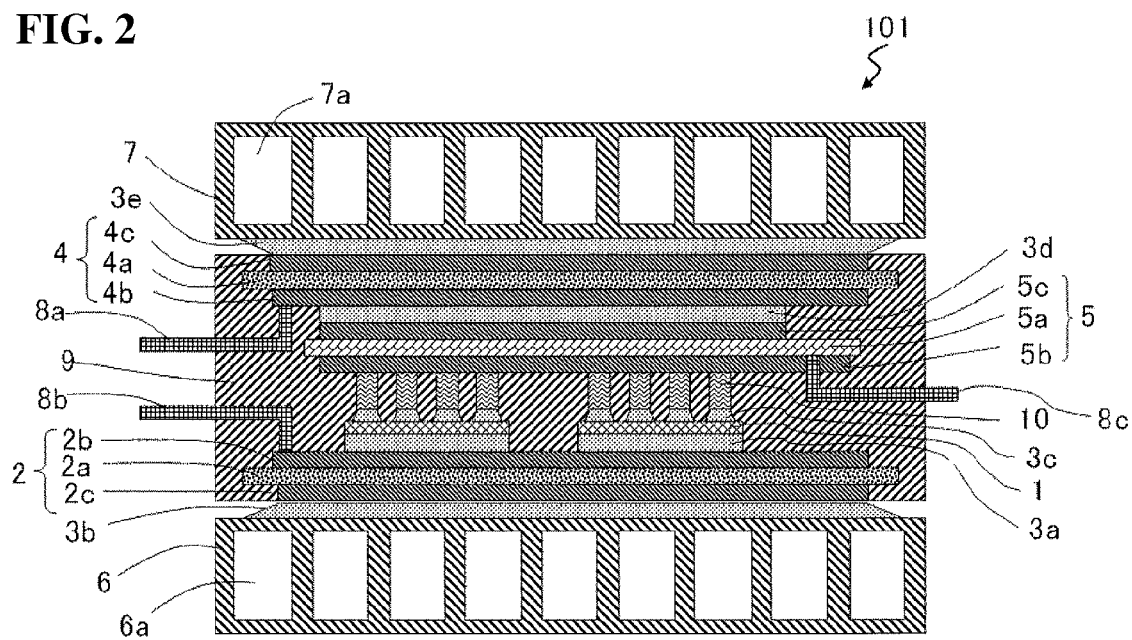
FIG. 2 is a cross-sectional view schematically illustrating a semiconductor module including two or more semiconductor elements in the semiconductor module according to the first embodiment of the invention.

FIG. 2 is a cross-sectional view schematically illustrating a semiconductor module 101 including two semiconductor elements 1 as a vertical structure according to a second embodiment of the invention. In the semiconductor module, the two semiconductor elements 1 are connected in parallel to each other to double the rated output of the semiconductor module. In addition, a plurality of semiconductor elements 1 may be different types. For example, an IGBT and an FWD can be connected in parallel to each other to obtain a protecting effect against counter electromotive force.

Second Embodiment of the Invention

Next, the second embodiment of the invention will be described.

Figure 3:
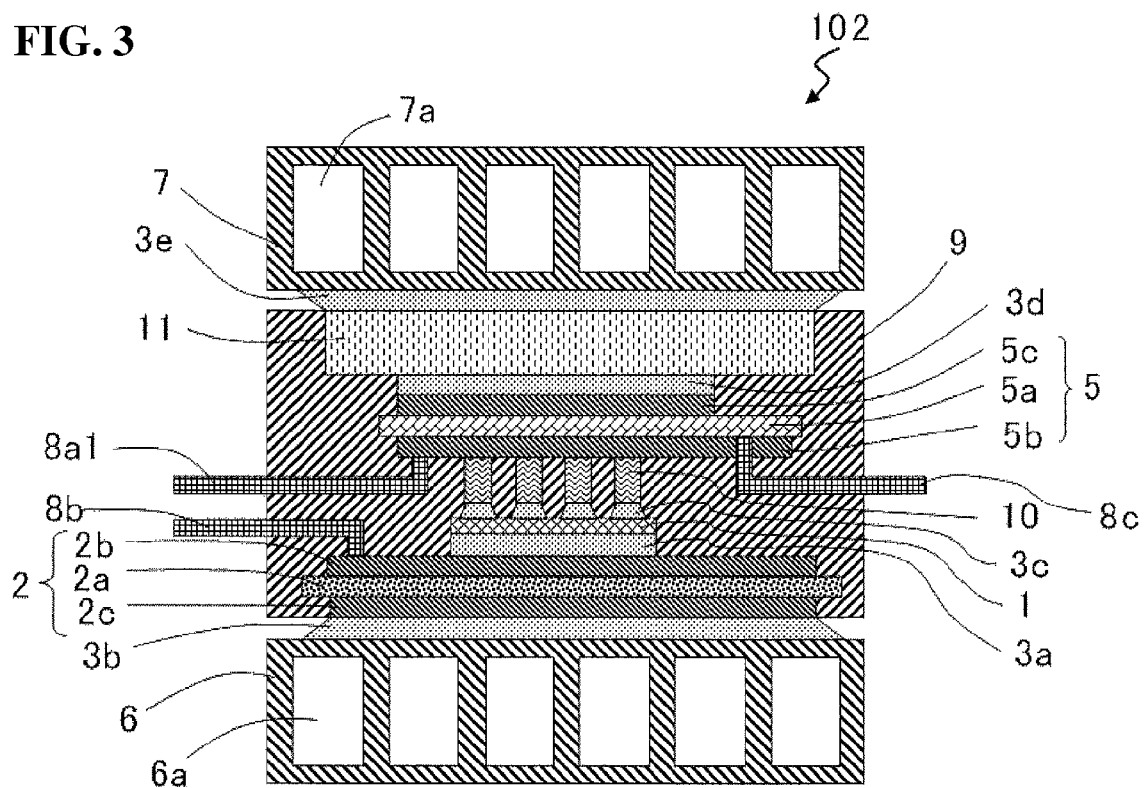
FIG. 3 is a cross-sectional view schematically illustrating a semiconductor module according to a second embodiment of the invention.

FIG. 3 is a cross-sectional view schematically illustrating a semiconductor module 102 according to the second embodiment of the invention. The semiconductor module 102 includes a semiconductor element 1, a first DCB substrate 2, a first ceramic insulating substrate 2a, a third metal film 2b, a fourth metal film 2c, solder 3a, solder 3b, solder 3c, solder 3d, solder 3e, a heat spreader 11, a sixth metal film 4c, a pin wiring substrate 5, a pin wiring insulating substrate 5a, a first metal film (circuit layer) 5b, a second metal film 5c, a first cooler 6, a cooling medium path 6a, a second cooler 7, a cooling medium path 7a, a terminal 8a, a terminal 8b, a terminal 8c, a sealing resin 9, and a pin 10.

In the second embodiment of the invention, the heat spreader 11 is provided between the pin wiring substrate 5 and the second cooler 7. The heat spreader 11 is made of a metal material with high thermal conductivity. For example, the heat spreader 11 is preferably made of copper. The thickness of the heat spreader 11 is designed on the basis of the amount of heat generated from the semiconductor element 1, an increase in the amount of heat which is transiently generated, and the tolerance of the cooling capacity of the second cooler 7.

The second metal film 5c of the pin wiring substrate 5 is electrically and thermally connected to the heat spreader 11 by the solder 3d. The heat spreader 11 is connected to the outer wall of the second cooler 7 by the solder 3e.

According to this structure, heat generated from the semiconductor element can be transferred from the lower surface of the semiconductor element 1 to the first cooler 6 through the first DCB substrate 2. In addition, the heat can be transferred to the pin wiring substrate 5 through the pin 10 connected to the upper surface of the semiconductor element 1, transferred to the heat spreader 11, and then transferred to the second cooler 7. The pin wiring substrate 5 functions as not only a wiring substrate but also a heat spreader for increasing a heat transmission area. Since the heat spreader 11 is made of a material with high thermal conductivity, it is possible to further disperse the flow of heat and to prevent the generation of a hot spot.

When it is determined that the output of the semiconductor module 102 is low and a melting point for the heating temperature of the semiconductor module 102 and an insulation performance can be satisfied, a printed circuit board made of, for example, a glass-filled epoxy resin may be used.

In addition, an increase in the thickness of the heat spreader 11 makes it possible to suppress an increase in the temperature of the semiconductor element using a buffering effect which is obtained by the thermal capacity of the heat spreader when the amount of heat generated from the semiconductor element increases rapidly.

In the second embodiment, the thermal resistance of a heat transfer path from the semiconductor element 1 to the second cooler 7 is low and an increase in temperature due to transient heat is suppressed by the buffering effect obtained by the thermal capacity of the heat spreader. Therefore, very high cooling capacity is obtained.

Third Embodiment of the Invention

Next, a third embodiment of the invention will be described.

A semiconductor module according to the third embodiment of the invention has a structure in which a plurality of semiconductor modules according to Embodiment 1 to 2 is arranged in a row such that side surfaces from which an input terminal and an output terminal do not protrude face each other. Each of a first cooler 6 and a second cooler 7 can be integrally provided so as to cover the entire row of the semiconductor modules.

Figure 4:
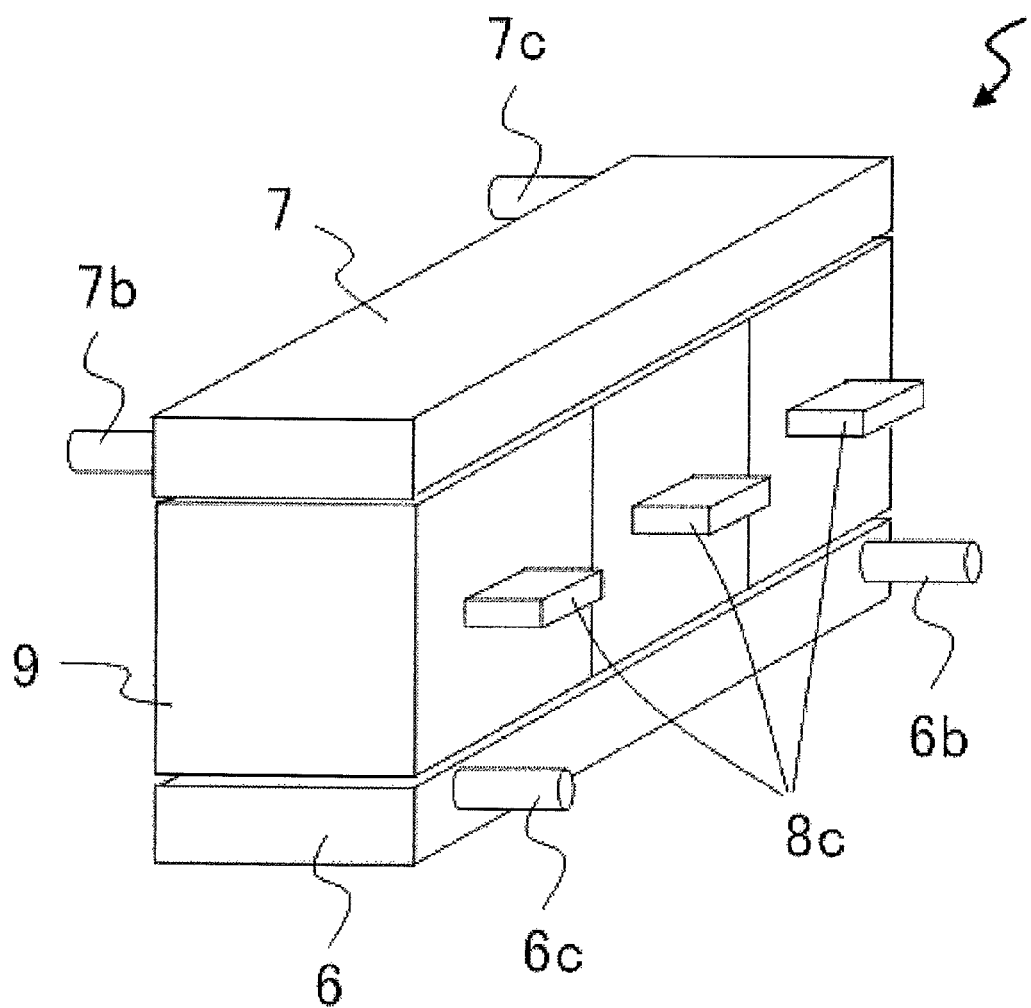
FIG. 4 is a perspective view illustrating a semiconductor module according to a third embodiment of the invention.

FIG. 4 is a perspective view illustrating a semiconductor module 103 according to the fourth embodiment of the invention in which a plurality of semiconductor modules 3 is arranged in a row. Each of the first cooler 6 and the second cooler 7 is integrally provided.

The first cooler 6 includes a cooling medium inlet 6b and a cooling medium outlet 6c. The second cooler 7 includes a cooling medium inlet 7b and a cooling medium outlet 7c. It is preferable that the flow directions of a cooling medium in the first cooler 6 and the second cooler 7 be opposite to each other. In this case, it is possible to effectively cool the semiconductor module 103.

As described above, according to the embodiments of the invention, it is possible to provide a semiconductor module which uses pin bonding and can improve cooling capacity.

EXPLANATIONS OF LETTERS OR NUMERALS

1 SEMICONDUCTOR ELEMENT
2 FIRST DCB SUBSTRATE
2a FIRST CERAMIC INSULATING SUBSTRATE
2b THIRD METAL FILM
2c FOURTH METAL FILM
3a SOLDER
3b SOLDER
3c SOLDER
3d SOLDER
3e SOLDER

4 SECOND DCB SUBSTRATE
4a SECOND CERAMIC INSULATING SUBSTRATE
4b FIFTH METAL FILM
4c SIXTH METAL FILM
5 PIN WIRING SUBSTRATE
5a PIN WIRING INSULATING SUBSTRATE
5b FIRST METAL FILM (CIRCUIT LAYER)
5c SECOND METAL FILM
6 FIRST COOLER
6a COOLING MEDIUM PATH
6b COOLING MEDIUM INLET
6c COOLING MEDIUM OUTLET
7 SECOND COOLER
7a COOLING MEDIUM PATH
7b COOLING MEDIUM INLET
7c COOLING MEDIUM OUTLET
8a TERMINAL
8a1 TERMINAL
8b TERMINAL
8c TERMINAL
9 SEALING RESIN
10 PIN
11 HEAT SPREADER
100 SEMICONDUCTOR MODULE
101 SEMICONDUCTOR MODULE
102 SEMICONDUCTOR MODULE
103 SEMICONDUCTOR MODULE

What is claimed is:

1. A semiconductor module comprising:
a semiconductor element;
a pin electrically and thermally connected to an upper surface of the semiconductor element;
a pin wiring substrate including a pin wiring insulating substrate, a first metal film provided on a rear surface of the pin wiring insulating substrate, and a second metal film provided on a front surface of the pin wiring insulating substrate, the first metal film being bonded to the pin;
a first DCB substrate including a first ceramic insulating substrate, a third metal film provided on a front surface of the first ceramic insulating substrate, and a fourth metal film provided on a rear surface of the first ceramic insulating substrate, the third metal film being bonded to a lower surface of the semiconductor element;
a first cooler thermally connected to the fourth metal film; and
a second cooler thermally connected to the second metal film.

2. The semiconductor module according to claim 1, wherein the pin wiring insulating substrate is made of a material selected from the group consisting of $Si_3N_4$, AlN and $Al_2O_3$.

3. The semiconductor module according to claim 1, further comprising: a second DCB substrate including a second ceramic insulating substrate, a fifth metal film provided on a rear surface of the second ceramic insulating substrate, and a sixth metal film provided on a front surface of the second ceramic insulating substrate,
wherein the second DCB substrate is provided between the second metal film and the second cooler so as to be thermally connected to the second metal film and the second cooler.

4. The semiconductor module according to claim 1, further comprising a heat spreader provided between the second metal film and the second cooler so as to be thermally connected to the second metal film and the second cooler.

5. The semiconductor module according to claim 1, wherein a plurality of sets of the semiconductor element and the pin is provided.

6. The semiconductor module according to claim 1, wherein the semiconductor element includes an input terminal and an output terminal extending from between the first cooler and the second cooler to an outside.

7. A semiconductor module comprising:
a plurality of semiconductor module units, each having, as a unit module, the semiconductor module according to claim 1,
wherein the plurality of semiconductor module units is arranged in a row such that side surfaces from which the input and output terminals of the semiconductor elements do not protrude face each other.

8. The semiconductor module according to claim 6, wherein each of the first cooler and the second cooler is integrally provided so as to cover an entire row of the module units.

9. The semiconductor module according to claim 1, wherein the semiconductor module is sealed with a sealing resin except for the first cooler, a surface which is thermally connected to the first cooler, the second cooler, and a surface which is thermally connected to the second cooler in the semiconductor module.

* * * * *